US 12,404,178 B2

(12) United States Patent
Ding et al.

(10) Patent No.: US 12,404,178 B2
(45) Date of Patent: Sep. 2, 2025

(54) ENERGY HARVESTING AND SELF-CLEANING SYSTEM BASED ON GRAPHENE AEROGELS AND PREPARATION METHOD THEREOF

(71) Applicants: JIANGSU UNIVERSITY, Zhenjiang (CN); CHANGZHOU UNIVERSITY, Changzhou (CN)

(72) Inventors: Jianning Ding, Zhenjiang (CN); Xiaoshuang Zhou, Zhenjiang (CN); Lvzhou Li, Zhenjiang (CN); Guanggui Cheng, Zhenjiang (CN); Ningyi Yuan, Zhenjiang (CN); Xinghao Hu, Zhenjiang (CN); Xu Dong, Zhenjiang (CN)

(73) Assignees: JIANGSU UNIVERSITY, Jiangsu (CN); CHANGZHOU UNIVERSITY, Jiangsu (CN)

( * ) Notice: Subject to any disclaimer, the term of this patent is extended or adjusted under 35 U.S.C. 154(b) by 924 days.

(21) Appl. No.: 17/558,729

(22) Filed: Dec. 22, 2021

(65) Prior Publication Data
US 2022/0115963 A1 Apr. 14, 2022

Related U.S. Application Data

(63) Continuation of application No. PCT/CN2020/071793, filed on Jan. 13, 2020.

(51) Int. Cl.
*C23C 14/35* (2006.01)
*B81B 3/00* (2006.01)
(Continued)

(52) U.S. Cl.
CPC .............. *C01B 32/194* (2017.08); *B81B 3/00* (2013.01); *C23C 14/185* (2013.01); *C23C 14/35* (2013.01);
(Continued)

(58) Field of Classification Search
CPC ..... C23C 14/185; C23C 14/35; C23C 14/046; C01B 32/194; C01P 2004/03; H02N 11/002; B81B 3/00
(Continued)

(56) References Cited

U.S. PATENT DOCUMENTS

2002/0080553 A1* 6/2002 Pekala ............... H01G 11/48
361/302
2012/0313591 A1* 12/2012 Brambilla ........... H01G 11/36
204/192.15

FOREIGN PATENT DOCUMENTS

CN 104241517 A 12/2014
CN 104495820 A 4/2015
(Continued)

OTHER PUBLICATIONS

Machine Translation CN 110155987 A (Year: 2019).*
(Continued)

*Primary Examiner* — Rodney G Mcdonald
(74) *Attorney, Agent, or Firm* — SZDC Law PC

(57) ABSTRACT

The invention relates to an energy harvesting and self-cleaning system based on graphene aerogels and its preparation method, which a layer of metal collector is sputtered on both sides of the freeze-dried graphene aerogel by magnetron sputtering; the graphene aerogel with collector is fixed on the side and bottom of the substrate in series and/or parallel connection, and then is put into the electrolyte to get the target system. The system provides a new idea for mechanical energy harvesting. Firstly introduced aerogels into the field of mechanical energy harvesting. In addition, the system can not only collect mechanical energy, but also absorb oil and other impurities in the ocean, playing the role of ocean cleaning. The energy collection system formed by single aerogel can produce ~220 mV open circuit voltage in
(Continued)

Sodium Chloride Solution or organic electrolyte, and generate 2 W/kg power density.

10 Claims, 3 Drawing Sheets

(51) Int. Cl.
    *C01B 32/194*     (2017.01)
    *C23C 14/18*     (2006.01)
    *H02N 11/00*     (2006.01)

(52) U.S. Cl.
    CPC ........ *H02N 11/002* (2013.01); *C01P 2004/03* (2013.01)

(58) Field of Classification Search
    USPC .................................................. 204/192.15
    See application file for complete search history.

(56) References Cited

FOREIGN PATENT DOCUMENTS

| | | |
|---|---|---|
| CN | 105011456 A | 11/2015 |
| CN | 105011462 A | 11/2015 |
| CN | 204949714 U | 1/2016 |
| CN | 205030587 U | 2/2016 |
| CN | 108620003 A | 10/2018 |
| CN | 109585184 A | 4/2019 |
| CN | 110155987 A | 8/2019 |
| WO | 2012170749 A2 | 12/2012 |

OTHER PUBLICATIONS

Liu et al., Preparation, structures and properties of three-dimesional graphne-based materials, Progress in Chemistry, 20129, 31(5), 667-680 (Mar. 21, 2019).

* cited by examiner

| Frequency/Hz<br>Compression height | 0.1 | 0.3 | 0.5 | 1 | 1.5 | 2 |
|---|---|---|---|---|---|---|
| 1mm   mV | 150.3 | 146.3 | 145.8 | 121.5 | 131.5 | 116.4 |
| 1.5mm mV | 218.2 | 204.4 | 195.1 | 161.8 | 158.8 | 159.1 |

ENERGY HARVESTING AND SELF-CLEANING SYSTEM BASED ON GRAPHENE AEROGELS AND PREPARATION METHOD THEREOF

This application is a Continuation Application of PCT/CN2020/071793, filed on Jan. 13, 2020, which is incorporated by reference for all purposes as if fully set forth herein.

FIELD OF THE INVENTION

The invention relates to the technical field of the energy harvesting and cleaning system thereof, in particular to an energy harvesting and self-cleaning system based on graphene aerogels and preparation method thereof.

BACKGROUND

Graphene aerogel as a flexible, highly elastic and highly adsorptive material, has excellent ultrafast and ultra high adsorption capacity for organic solvents. It is the most powerful oil absorbing material reported. At the same time, it may become an ideal energy storage and thermal insulation material, catalyst carrier and efficient composite material, which has broad prospects.

At the same time, mechanical energy, as a kind of abundant energy in nature, has been widely concerned, and it is more and more urgent to develop environmentally friendly and sustainable mechanical energy collection technology. At the same time, as an effective mechanical energy, marine mechanical energy has become the focus of research. With the development of the piezoelectric materials and the triboelectrification technology, more and more devices of piezoelectric or triboelectrification are using to collect mechanical energy in the environment. However, the application of graphene aerogels has not yet involved in the field of energy harvesting.

The inventor based on his experience and expertise in designing and manufacturing such products, and actively applied research and innovation in order to create an energy harvesting and self-cleaning system based on graphene aerogels and preparation method thereof and make it more practical. After continuous research, design, repeated trial sample and improvement, the invention with practical value is finally created.

SUMMARY OF THE INVENTION

The first main purpose of the invention is to propose an energy harvesting and self-cleaning system based on graphene aerogels, which realizes energy harvesting and cleaning effect of the system, and applies the prepared graphene aerogels to the energy harvesting and cleaning system. Then a new energy harvesting mechanism is proposed: when applied to the ocean and forming the system, the graphene aerogel in the electrolyte will cause the migration of the positive and negative ions in the process of mechanical compression because of the difference in the adsorption layer between the positive and negative ions in the graphene aerogel itself. Therefore, in the process of compression and recovery, there will be voltage difference and current with the counter electrode, so as to achieve the purpose of energy collection.

The above object of the present invention is achieved by the following technical solutions:

An energy harvesting and self-cleaning system based on graphene aerogels, a layer of metal collector is sputtered on both sides of the freeze-dried graphene aerogel by magnetron sputtering; the graphene aerogel with collector is fixed on the side and bottom of the substrate in series and/or parallel connection, and then is put into the electrolyte to get the target system.

Preferred, the metal used by the metal collectors is one of noble metal Ag or Pt, the common metal Al or Cu.

Preferred, the thickness of the metal collectors is 500 nm-50 μm; in further, the optimum sputtering thickness is 1 um.

Preferred, the electrolyte used is organic or inorganic electrolyte. The preferred electrolyte is sodium chloride solution, with a concentration of 0.1 mol/L-5 mol/L.

The energy collecting and self-cleaning system based on graphene aerogels can also be applied to systems other than ocean. The mechanical properties of graphene aerogels can be collected on the basis of mechanical movement, and the impurities such as oil and contaminants in the electrolytic liquid can also be adsorbed for cleaning.

The second main purpose of the invention is to propose a preparation method of energy harvesting and self-cleaning system based on graphene aerogels, mainly the preparation of graphene aerogels, and by controlling the performance of the materials, the system can effectively collect energy and clean use.

The above object of the present invention is achieved by the following technical solutions:

The preparation method of the energy harvesting and self-cleaning system based on graphene aerogels, the preparation of the graphene aerogel is carried out through the following steps:

S1. Weighting the graphene oxides, Graphene oxide can be prepared by Hummer's method, the size of flake graphite used in the preparation of graphene oxide is 30-50 mesh, the ultrasonic technology is used to disperse in self-made ultrapure water to prepare aqueous solution, the ultrasonic power is 800 W and the ultrasonic time is 5 minutes; The homemade ultrapure water was prepared by Milli Q ultrapure water system;

S2. After the aqueous solution of graphene oxide and the solution of nano-composite is mixed uniformly, the reducing agent is added to obtain the mixture;

S3. Heating the mixture prepared by step S2 in a high pressure reactor and keeping the temperature;

S4. The mixture obtained by step S3 is removed and cryopreserved and freeze-dried to obtain graphene aerogels.

Preferred, the concentration of graphene oxide in aqueous solution of step S1 is 5 mg/ml-15 mg/ml. The concentration of graphene oxide aqueous solution is 5 mg/mL-10 mg/ml; More preferably, the concentration of graphene oxide aqueous solution is 5 mg/ml; If the concentration of aqueous solution of graphene oxide is over 15 mg/ml or low concentration is lower than 5 mg/ml, the aerogels prepared are easier to collapse, and the elasticity is not as good as that of 5 mg/ml.

Preferred, the nanocomposites in step S2 are one or more of CNTs, MXene or conductive polymers PEDOT:PSS, PPy or PAN.

Preferred, the volume mixing ratio of the graphene oxide in aqueous solution and the nanocomposite was (1:1)-(1:30). Furthermore, the volume mixing ratio of graphene oxide and nanocomposite is (1:1)-(1:20); More preferably, the volume mixing ratio of graphene oxide and nanocomposite material is (1:1)-(1:10); The volume mixing ratio of graphene oxide and nano composite is 1:5; When the volume mixing of graphene oxide and nanocomposites is relatively high, the aerogel elasticity of the final preparation will be relatively good. When the volume mixture of graphene oxide and nanocomposites is low, the conductivity of the final aerogel will be relatively high. According to the actual use of the scene in the setting of 1:30, scale range to make the corresponding choice.

Preferred, step S2, the reducing agent was one or more of ethylenediamine, hydroiodic acid, ammonia water or hydrazine hydrate. The further optimized reducing agent is ethylenediamine; because of the difference in final properties of aerogels prepared by different reducing agents, the affinity of the aerogels prepared has certain influence. Therefore, the above reducing agents are selected selectively, and the aerogels prepared by using ethylenediamine as reducing agent are better hydrophilic. Therefore, ethylenediamine is chosen as reducing agent when applied to water system.

Preferred, the keeping temperature of high pressure reactor in step S2 is 90-180° C., the keeping time is 60-120 minutes, the further optimized autoclave has a heat preservation temperature of 90° C. and a heat preservation time of 60 minutes.

Preferred, the cryogenic freezing temperature in step S4 is −20-100° C., and the keeping time is 1 minutes-300 minutes, the further optimized cryogenic freezing temperature is −20° C. and the holding time is 120 minutes.

Preferred, the freeze-dried temperature is −70° C., and the keeping time is 24-72 h, the further optimized freeze-drying time is 48 h.

The control of heating temperature, holding temperature and holding time in the above operation is mainly to control the progress reflected, so as to obtain the final optimized stable structure; The control of cryogenic freezing temperature and freezing time mainly controls the size of the voids in the stacking process by controlling the growth rate of ice crystals, and optimizes the structure of the aerogels. It needs the joint control of temperature and time to achieve the above purpose.

The third main purpose of the invention is to prepare graphene aerogels based on the preparation method of graphene aerogels.

The fourth main purpose of the invention is to propose a method for preparing graphene aerogels, and the stacking morphology of the channels can be adjusted by controlling the technological parameters.

Through the above technical solutions, beneficial effects of the present invention are:

1. The invention controls the growth of the ice crystals by controlling the doped materials and controlling the freezing speed and freezing time in the freezing process, so as to regulate the size of the graphene aerogel pores, and the size of the control can effectively control the ion transport characteristics of the energy harvesting of the graphene aerogels, thereby realizing the regulation and control of the performances for different application scenarios.

2. The invention pioneered a new energy harvesting mechanism: in the process of mechanical compression, graphene aerogels in the electrolyte are due to the difference in the adsorption layer between the positive and negative ions of the graphene aerogels themselves, resulting in the asynchrony of the migration of positive and negative ions in the process, therefore, in the process of compression and recovery, there will be voltage difference and current with the counter electrode, and then realize the collection of energy.

3. The invention provides a new idea for mechanical energy harvesting. For the first time, the graphene aerogel is introduced into the field of mechanical energy harvesting, and the system not only can collect mechanical energy, but also adsorb impurities such as oil and dirt in the sea, thereby playing a role of marine cleaning. The energy collection system formed by single aerogel can produce ~220 mV open circuit voltage in Sodium Chloride Solution or organic electrolyte, and generate the power density of 2 W/kg.

DRAWINGS

REFERENCE NUMBER 1. foam board, 2. metal collector, 3. graphene aerogel, 4. electrolyte solution, 5. metal pair electrode.

DETAILED DESCRIPTION OF PREFERRED EMBODIMENTS

In order to further explain the technical means and effectiveness of the invention for achieving the predetermined invention purpose, the energy collection and self-cleaning system based on graphene aerogel based on the invention and its preparation method, characteristics and functions thereof are described in detail.

The raw material sources used in the following examples are as follows:
Graphite: McLean Reagent Co., Ltd;
Ultra pure water: Preparation of Milli Q ultra pure water system;
MXene: 11 Technology Limited;
Ethylenediamine: Sinopharm Reagent Co., Ltd;
Carbon nanotubes: Shenzhen nanoport Co., Ltd;
Foam board: Kunshan Guangjia new materials Co., Ltd.

Example 1

Figure 1:
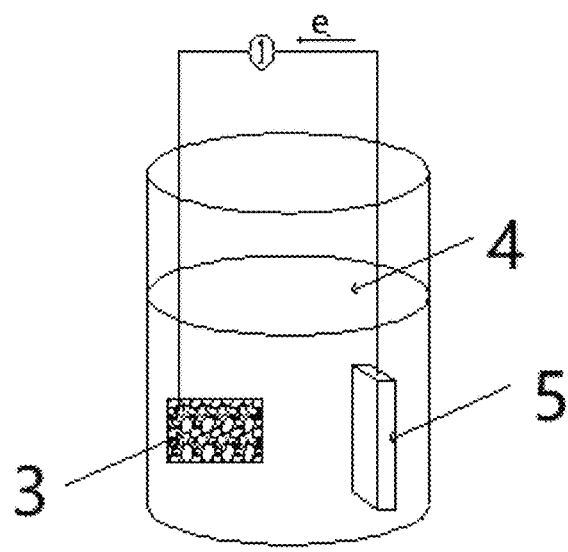
FIG. 1 is a schematic diagram of the principle of energy collection and self-cleaning system based on graphene aerogels.
Figure 2:
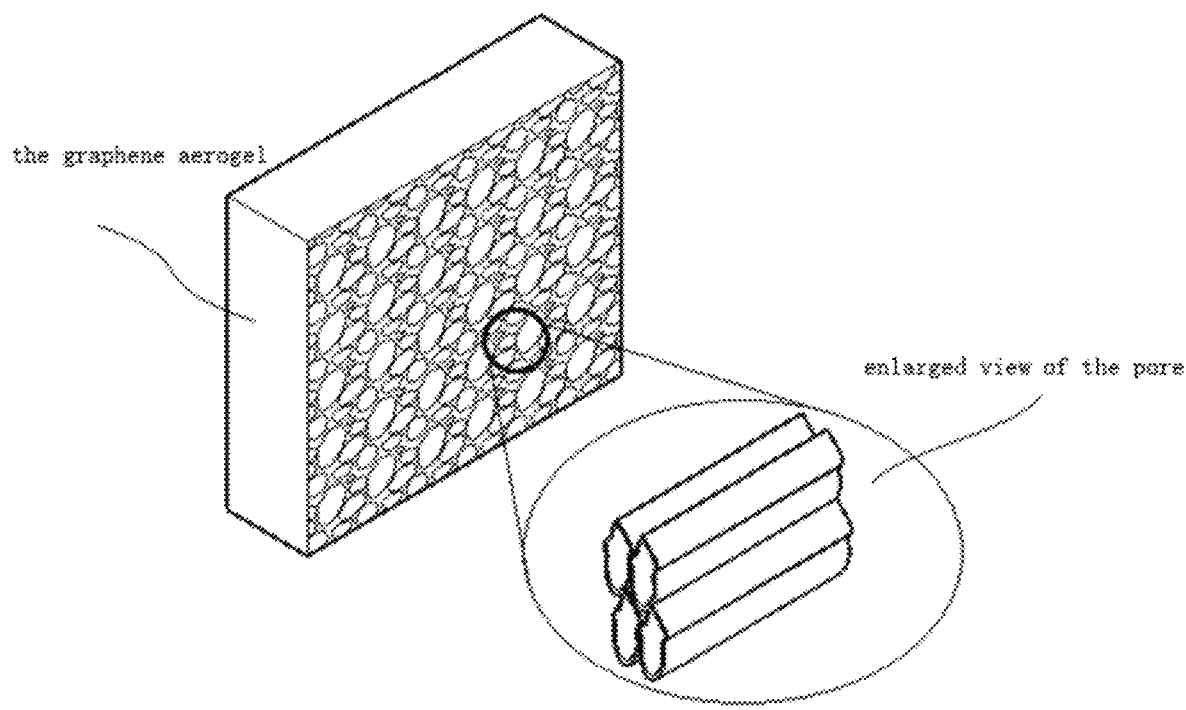
FIG. 2 is a schematic diagram of the enlargement of the simulated graphene aerogel pore.

According to FIGS. 1 and 2, the working principle of the energy collection and self-cleaning system based on graphene aerogels is presented in this paper. In particular, graphene aerogels in the electrolyte are due to the difference in the adsorption layer between the positive and negative ions of the graphene aerogels themselves, resulting in the asynchrony of the migration of positive and negative ions in the process, therefore, in the process of compression and recovery, there will be voltage difference and current with the counter electrode, and then realize the collection of energy.

The preparation method of graphene aerogel includes the following steps:
S1. The graphene oxide prepared by Hummer's was weighed and the size of natural graphite used for preparing graphene oxide was 30 mesh. Then the graphene oxide sheets were dispersed in ultrapure water to prepare 5 mg/ml aqueous solution by using an 800 W ultrasonic disperser;

S2. After ultrasonic mixing graphene oxide aqueous solution and 1 mg/ml Mxene aqueous solution in a volume ratio of 1:1, 20 μL of ethylenediamine reducing agent was added;

S3. Put it into 20 ml autoclave and keep it at 90° C. for 120 minutes;

S4. The samples were frozen at −20° C. for 120 minutes and then freeze-dried at −70° C. for 48 hours, and obtain the target product.

Figure 3:
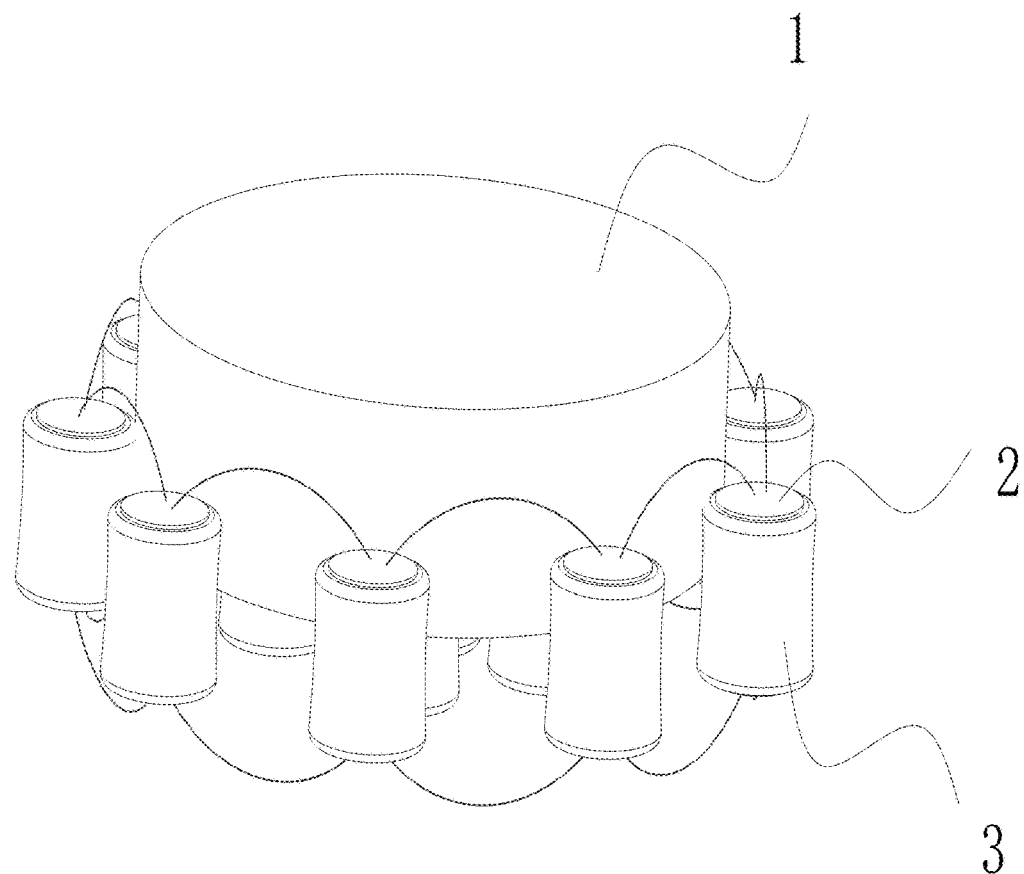
FIG. 3 is a schematic diagram of parallel connection between energy harvesting and self-cleaning system based on graphene aerogels.

A marine energy harvesting and self-cleaning system is prepared by using graphene aerogels, including the following steps:

(1) Sputtered a layer of metal silver collector 2 on the two sides of the freeze-dried aerogel by magnetron sputtering, with a thickness of 1 μm;

(2) The graphene aerogel 3 with a collector is fixed on the side and bottom of the commercial foam board 1 in parallel, and then placed in different concentrations of sodium chloride electrolyte to obtain an energy harvesting and environmental cleaning system as shown in FIG. 3.

Figure 4:
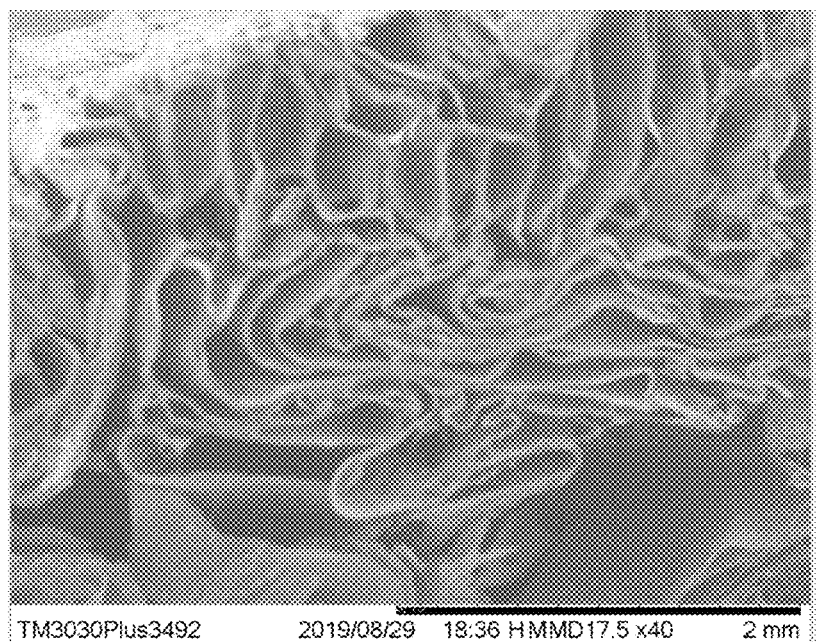
FIG. 4 is a SEM section of graphene aerogels for the system.

For the graphene aerogel 3 used in the system, the microstructure was observed by scanning electron microscope. As shown in FIG. 4, the pores formed by graphene lamellae can be clearly observed. The pore size is 100-200 microns, which ensures the transmission channel of microfluidics.

Figures 5, 6:
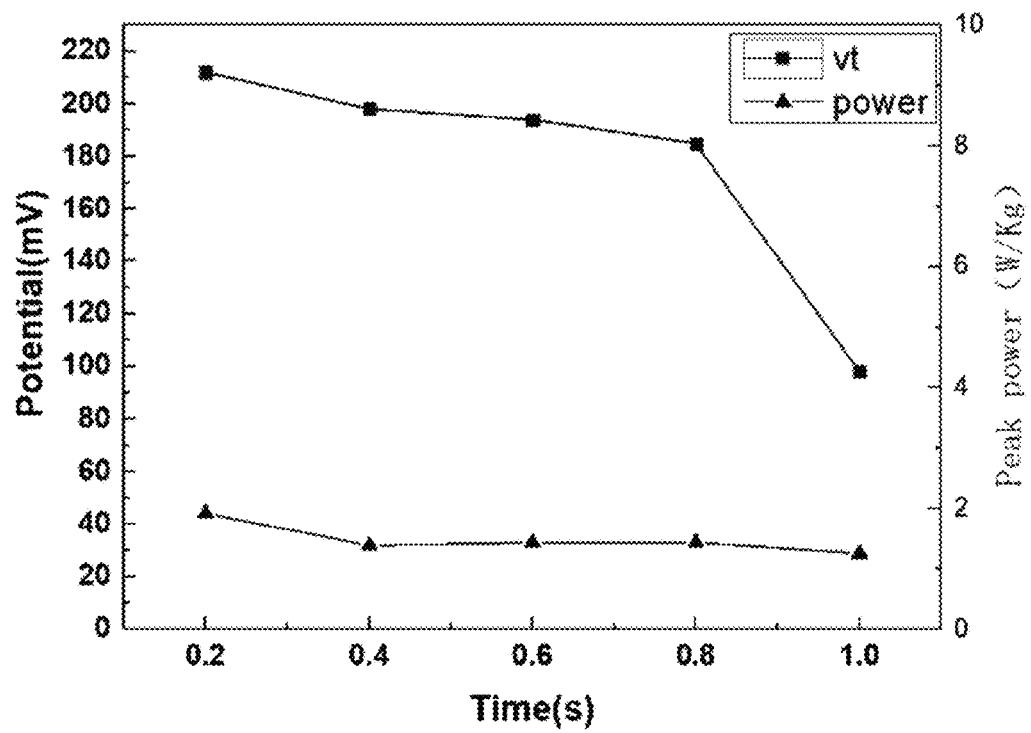
FIG. 5 is a performance diagram of a single graphene aerogel for sodium chloride electrolyte in the system.
FIG. 6 shows the electricity generation property of single graphene aerogel used in organic TEABF4/PC electrolyte.

According to FIGS. 5 and 6, the energy harvesting performance diagram of a single graphene aerogel applied to the energy harvesting and self-cleaning system, the graphene aerogel can achieve 220 mV opening pressure in the water and organic systems, and a load power up to 2 W/Kg.

Example 2

The preparation method of graphene aerogel includes the following steps:

S1. The graphene oxide prepared by Hummer's was weighed, and the size of the natural graphite used in the preparation of graphene oxide was 50 mesh, then the graphene oxide sheets were dispersed in ultra pure water to prepare an aqueous solution of 15 mg/ml by using an 800 W ultrasonic disperser;

S2. Weigh graphene oxide aqueous solution and 1 mg/ml Mxene aqueous solution, mix them with ultrasonic wave at the ratio of 1:5, and then add 20 μL of ethylenediamine reducing agent;

S3. Put it into 20 ml autoclave and keep it at 90° C. for 120 minutes;

S4. The samples were frozen at −20° C. for 120 minutes and then freeze-dried at −70° C. for 48 hours, and obtain the target product.

A marine energy harvesting and self-cleaning system is prepared by using graphene aerogels, including the following steps:

(1) Sputtered a layer of metal platinum collector 2 on the freeze-dried graphene aerogel 3 by magnetron sputtering, with a thickness of 1 μm;

(2) The graphene aerogel with collector, according to FIG. 1, is fixed on the side and bottom of the commercial foam board 1 in parallel, and then placed in different concentrations of sodium chloride electrolyte to obtain an energy harvesting and environmental cleaning system.

Example 3

The preparation method of graphene aerogel includes the following steps:

S1. The graphene oxide prepared by Hummer's was weighed, and the size of the natural graphite used in the preparation of graphene oxide was 50 mesh, then the graphene oxide sheets were dispersed in ultra pure water to prepare an aqueous solution of 15 mg/ml by using an 800 W ultrasonic disperser;

S2. Weigh graphene oxide aqueous solution and 1 mg/ml PEDOT-PSS aqueous solution, mix them with ultrasonic wave at the ratio of 1:5, and then add 20 μL of ethylenediamine reducing agent;

S3. Put it into 20 ml autoclave and keep it at 90° C. for 120 minutes;

S4. The samples were frozen at −20° C. for 120 minutes and then freeze-dried at −70° C. for 48 hours, and obtain the target product.

A marine energy harvesting and self-cleaning system is prepared by using graphene aerogels, including the following steps:

(1) Sputtered a layer of metal silver collector on the freeze-dried graphene aerogel by magnetron sputtering, with a thickness of 1 μm;

(2) A graphene aerogel with a collector is fixed on the side and bottom of the commercial foam board in series (not shown in the figures), and then placed in different concentrations of seawater electrolyte to obtain an energy harvesting and environmental cleaning system.

Example 4

The preparation method of graphene aerogel includes the following steps:

S1. The graphene oxide prepared by Hummer's was weighed, and the size of the natural graphite used in the preparation of graphene oxide was 30 mesh, then the graphene oxide sheets were dispersed in ultra pure water to prepare an aqueous solution of 5 mg/ml by using an 800 W ultrasonic disperser;

S2. Weigh graphene oxide aqueous solution and 1 mg/ml Carbon nanotubes aqueous solution, mix them with ultrasonic wave at the ratio of 1:1, 1:2, 1:5 and 1:10 then add 20-80 μL of ethylenediamine reducing agent;

S3. Put it into 20 ml autoclave and keep it at 90° C. for 120 minutes;

S4. The samples were frozen at −20° C. for 120 minutes and then freeze-dried at −70° C. for 48 hours, and obtain the target product.

A marine energy harvesting and self-cleaning system is prepared by using graphene aerogels, including the following steps:

(1) Sputtered a layer of metal silver collector on the freeze-dried graphene aerogel by magnetron sputtering, with a thickness of 1 μm;

(2) A graphene aerogel with a collector is fixed on the side and bottom of the commercial foam board in series (not shown in the figure), and then placed in different concentrations of seawater electrolyte to obtain an energy harvesting and environmental cleaning system.

Example 5

The preparation method of graphene aerogel includes the following steps:
- S1. The graphene oxide prepared by Hummer's was weighed, and the size of the natural graphite used in the preparation of graphene oxide was 30 mesh, then the graphene oxide sheets were dispersed in ultra pure water to prepare an aqueous solution of 5 mg/ml by using an 800 W ultrasonic disperser;
- S2. Weigh graphene oxide aqueous solution and 1 mg/ml Carbon nanotubes aqueous solution, mix them with ultrasonic wave at the ratio of 1:1, 1:2, 1:5 and 1:10 then add 20-80 µL of ethylenediamine reducing agent;
- S3. Put it into 20 ml autoclave and keep it at 120° C. for 120 minutes;
- S4. The samples were frozen at −40° C. for 120 minutes and then freeze-dried at −70° C. for 72 hours, and obtain the target product.

A marine energy harvesting and self-cleaning system is prepared by using graphene aerogels, including the following steps:
- (1) Sputtered a layer of metal copper collector 2 on the freeze-dried graphene aerogel 3 by magnetron sputtering, with a thickness of 1 µm;
- (2) The graphene aerogel with collector, 3, according to FIG. 1, is fixed on the side and bottom of the commercial foam board 1 in parallel, and then placed in different concentrations of sodium chloride electrolyte to obtain an energy harvesting and environmental cleaning system.

Example 6

The preparation method of graphene aerogel includes the following steps:
- S1. The graphene oxide prepared by Hummer's was weighed, and the size of the natural graphite used in the preparation of graphene oxide was 30 mesh, then the graphene oxide sheets were dispersed in ultra pure water to prepare an aqueous solution of 5 mg/ml by using an 800 W ultrasonic disperser;
- S2. Weigh graphene oxide aqueous solution and 1 mg/ml Carbon nanotubes aqueous solution, mix them with ultrasonic wave at the ratio of 1:1, 1:2, 1:5 and 1:10 then add 20-80 µL of ethylenediamine reducing agent;
- S3. Put it into 20 ml autoclave and keep it at 120° C. for 120 min;
- S4. The samples were frozen at −40° C. for 120 min and then freeze-dried at −70° C. for 72 hours, and obtain the target product.

A marine energy harvesting and self-cleaning system is prepared by using graphene aerogels, including the following steps:
- (1) Sputtered a layer of metal silver collector 2 on the freeze-dried graphene aerogel 3 by magnetron sputtering, with a thickness of 1 µm;
- (2) The graphene aerogel with collector is fixed on the side and bottom of the commercial foam board in series, and then is put into the TEABF4/PC organic electrolyte to obtain an energy harvesting and environmental cleaning system.

The energy collecting and self-cleaning system based on graphene aerogels is not only limited to collecting and cleaning marine energy, but also can be formed and applied on the basis of mechanical movement, including scenes of lakes, rivers, hydropower stations or moving electrolytes, so as to realize energy collection and cleaning.

Those skilled in the art should be understood, that this invention is not limited by the above-mentioned embodiments. The above-mentioned embodiments and the description in the specification only illustrate the principles of the present invention. Without departing from the spirit and scope of the present invention, the present invention will have different modifications or replacements, and these modifications and replacements should all be within the protection scope of the present invention. The protection scope of the present invention shall be subject to that defined by the claims and their equivalents.

The invention claimed is:

1. An energy harvesting and self-cleaning system based on graphene aerogels, comprising:
a freeze-dried graphene aerogel; and
a layer of a metal collector that is sputtered directly on both sides of the same freeze-dried graphene aerogel by magnetron sputtering;
wherein the freeze-dried graphene aerogel with the metal collector is fixed on a side and a bottom of a substrate in series and/or parallel connection, and then is put into an electrolyte to get a target system.

2. The energy harvesting and self-cleaning system based on graphene aerogels according to claim 1, wherein a metal used by the metal collector is Ag, Pt, Al or Cu.

3. The energy harvesting and self-cleaning system based on graphene aerogels according to claim 1, wherein a thickness of the metal collector is 500 nm-50 µm.

4. The energy harvesting and self-cleaning system based on graphene aerogels according to claim 1, wherein a preparation of the freeze-dried graphene aerogel is carried out through the following steps:
S1, weighing a graphene oxide, and then dispersing the graphene oxide in water to obtain a graphene oxide solution;
S2, uniformly mixing a nano-composite solution and the graphene oxide solution and adding a reducing agent to obtain a mixture;
S3, heating the mixture prepared by step S2 in a reactor; and
S4, removing the mixture obtained by step S3 and freeze-drying to obtain the freeze-dried graphene aerogel.

5. The energy harvesting and self-cleaning system based on graphene aerogels according to claim 4, wherein a concentration of the graphene oxide solution in step S1 is 5 mg/ml-15 mg/ml.

6. The energy harvesting and self-cleaning system based on graphene aerogels according to claim 5, wherein a volume mixing ratio of the graphene oxide solution and the nanocomposite solution is (1:1)-(1:30).

7. The energy harvesting and self-cleaning system based on graphene aerogels according to claim 4, wherein step S2, the reducing agent is ethylenediamine, hydroiodic acid, ammonia water or hydrazine hydrate.

8. The energy harvesting and self-cleaning system based on graphene aerogels according to claim 7, wherein in step S2, heating is at 90-180° C. for 60 minutes-120 minutes.

9. The energy harvesting and self-cleaning system based on graphene aerogels according to claim 8, wherein in step 4, freeze-drying is at −20° C. to −100° C. for 1 minutes-300 minutes.

10. The energy harvesting and self-cleaning system based on graphene aerogels according to claim 8, wherein freeze-drying is at −70° C. for 24-72 hours.

\* \* \* \* \*